United States Patent
Brugger et al.

(10) Patent No.: US 9,536,770 B2
(45) Date of Patent: Jan. 3, 2017

(54) METHOD AND APPARATUS FOR LIQUID TREATMENT OF WAFER SHAPED ARTICLES

(71) Applicant: LAM RESEARCH AG, Villach (AT)

(72) Inventors: Michael Brugger, Millstatt (AT); Karl-Heinz Hohenwarter, Dellach / Gail (AT); Dieter Spitaler, Wernberg (AT); Gerald Anton, Paternion (AT)

(73) Assignee: LAM RESEARCH AG, Villach (AT)

( * ) Notice: Subject to any disclaimer, the term of this patent is extended or adjusted under 35 U.S.C. 154(b) by 357 days.

(21) Appl. No.: 14/155,103

(22) Filed: Jan. 14, 2014

(65) Prior Publication Data
US 2015/0200123 A1    Jul. 16, 2015

(51) Int. Cl.
  H05B 3/68       (2006.01)
  C23C 16/00      (2006.01)
  H01L 21/687     (2006.01)
  H01L 21/67      (2006.01)

(52) U.S. Cl.
  CPC ... *H01L 21/68728* (2013.01); *H01L 21/67051* (2013.01); *H01L 21/67109* (2013.01); *H01L 21/67115* (2013.01); *Y10T 279/1993* (2015.01)

(58) Field of Classification Search
  CPC .................... H01L 21/67051; H01L 21/67109; H01L 21/67115; H01L 21/68714–21/68742; Y10T 279/1993
  USPC ................. 219/444.1; 118/728–730
  See application file for complete search history.

(56) References Cited

U.S. PATENT DOCUMENTS

| | | | |
|---|---|---|---|
| 4,903,717 A | 2/1990 | Sumnitsch | |
| 5,513,668 A | 5/1996 | Sumnitsch | |
| 5,645,646 A * | 7/1997 | Beinglass | H01L 21/6875 118/500 |
| 6,100,505 A * | 8/2000 | Pike | H01L 21/67103 118/725 |
| 6,403,933 B1 * | 6/2002 | Strodtbeck | B25B 11/005 118/725 |
| 8,753,448 B2 * | 6/2014 | Yasuhara | C23C 16/303 118/500 |
| 2002/0195058 A1 * | 12/2002 | Choi | H01L 21/67109 118/728 |
| 2007/0289527 A1 * | 12/2007 | Ito | G03F 7/162 118/52 |
| 2010/0206481 A1 | 8/2010 | Gigacher et al. | |
| 2011/0148022 A1 * | 6/2011 | Brugger | H01L 21/68757 269/296 |
| 2013/0061873 A1 | 3/2013 | Hohenwarter et al. | |

* cited by examiner

Primary Examiner — Sang Y Paik

(57) ABSTRACT

An apparatus for processing wafer-shaped articles includes a rotary chuck adapted to hold a wafer shaped article thereon. The rotary chuck includes a peripheral series of pins configured to contact an edge region of a wafer-shaped article. Each of the pins projects upwardly from the rotary chuck, and each of the pins is individually secured to the rotary chuck by a respective connecting mechanism. Any selected one of the pins can be removed from the rotary chuck by disconnecting its corresponding connecting mechanism without removing any structure of the rotary chuck that surrounds any others of the pins.

18 Claims, 4 Drawing Sheets

METHOD AND APPARATUS FOR LIQUID TREATMENT OF WAFER SHAPED ARTICLES

BACKGROUND OF THE INVENTION

1. Field of the Invention

The invention relates to apparatus for liquid treatment of wafer-shaped articles.

2. Description of Related Art

Semiconductor wafers undergo a variety of wet processing stages during manufacture of integrated circuits. To accommodate such processes, a single wafer may be supported in relation to one or more treatment fluid nozzles by a chuck associated with a rotatable or non-rotatable carrier.

U.S. Pat. Nos. 4,903,717 and 5,513,668 describe such chucks wherein a plurality of pins assemblies arranged in a circular series contact a peripheral edge of the wafer. The contact surfaces of the pin assemblies are eccentric to the rotational axes of the pin assemblies, and can thus be driven in unison by a common ring gear between a radially inward use position and a radially outward loading and unloading position. Commonly-owned copending application U.S. 2010/0206481 describes a variation on such pin assemblies in which the contact surfaces of the pin assemblies support the weight of the wafer, and position the wafer at a fixed height above the upper plate of the chuck.

More recent versions of such chucks have included heating assemblies that are positioned above the upper plate of the chuck but below the level where a wafer is supported, an example of such a chuck being described in commonly-owned copending application U.S. 2013/0061873.

The repair and maintenance of such chucks is relatively complicated and time-consuming, because, in order to replace even one of the pin assemblies, the chuck has to be disassembled from its associated drive and elevating unit, removed from its associated process module, and dismantled to its individual components under clean room conditions. This operation is especially time-consuming in the case of chucks equipped with heating assemblies as identified above, because the entire lamp housing has to be removed before the chuck itself can be removed from its associated drive unit.

SUMMARY OF THE INVENTION

Thus, in one aspect, the present invention relates to an apparatus for processing wafer-shaped articles, comprising a rotary chuck adapted to hold a wafer shaped article thereon. The rotary chuck comprises a peripheral series of pins configured to contact an edge region of a wafer-shaped article. Each of the pins projects upwardly from the rotary chuck, and each of the pins is individually secured to the rotary chuck by a respective connecting mechanism. Any selected one of the pins can be removed from the rotary chuck by disconnecting its corresponding connecting mechanism without removing any structure of the rotary chuck that surrounds any others of the pins.

In preferred embodiments of the apparatus according to the present invention, the rotary chuck comprises a chuck base body and a cover, and wherein each of the pins projects upwardly from the cover.

In preferred embodiments of the apparatus according to the present invention, the rotary chuck is mounted for rotation about a central spindle, and a heating assembly is stationarily mounted above an upper surface of rotary chuck and below a level at which the pins contact an edge of a wafer-shaped article.

In preferred embodiments of the apparatus according to the present invention, each connecting mechanism comprises an insert having an opening through which an upper part of a corresponding pin can pass, each the pin comprises a base portion that is wider than the opening in its corresponding insert, and each insert is received in a corresponding recess formed in an upper surface of the rotary chuck and is fastened to the rotary chuck with the base portion of a corresponding pin captive within the rotary chuck beneath the insert.

In preferred embodiments of the apparatus according to the present invention, when the connecting mechanism is disconnected from the rotary chuck, the corresponding pin and insert can be lifted conjointly away from the chuck by pulling upwardly on the corresponding pin.

In preferred embodiments of the apparatus according to the present invention, a ring gear is mounted interiorly of the chuck, the ring gear being in simultaneous meshing engagement with each of the circular series of pins.

In preferred embodiments of the apparatus according to the present invention, each of the circular series of pins has an enlarged base confined within the rotary chuck and comprises gear teeth meshing with the ring gear.

In preferred embodiments of the apparatus according to the present invention, the insert is secured to the rotary chuck by a pair of screws.

In preferred embodiments of the apparatus according to the present invention, each of the pair of screws has a collar that keeps the screw attached to the insert.

In preferred embodiments of the apparatus according to the present invention, the insert comprises screw threading on a lower surface thereof and is screwed into a threaded bore formed with the recess.

In preferred embodiments of the apparatus according to the present invention, an O-ring is mounted in a groove surrounding the recess, to prevent ingress of liquid into the rotary chuck between the insert and the recess.

In preferred embodiments of the apparatus according to the present invention, a lip seal is mounted between the insert and a shoulder of the recess, to prevent ingress of liquid into the rotary chuck between the insert and the recess.

In preferred embodiments of the apparatus according to the present invention, each of the series of pins and its associated connecting mechanism is made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

In another aspect, the present invention relates to a rotary chuck for processing wafer-shaped articles, the rotary chuck being adapted to hold a wafer shaped article thereon. The rotary chuck comprises a peripheral series of pins configured to contact an edge region of a wafer-shaped article. Each of the pins projects upwardly from an upper plate of the rotary chuck, and each of the pins is individually secured to the upper plate by a respective connecting mechanism. Any selected one of the pins can be removed from the rotary chuck by disconnecting its corresponding connecting mechanism without removing the upper plate.

In preferred embodiments of the rotary chuck according to the present invention, each connecting mechanism comprises an insert having an opening through which an upper part of a corresponding pin can pass, and each pin comprises a base portion that is wider than the opening in its corresponding insert. Each insert is received in a corresponding recess formed in the upper plate and is fastened to the rotary chuck with the base portion of a corresponding pin captive within the rotary chuck beneath the insert.

In preferred embodiments of the rotary chuck according to the present invention, when the connecting mechanism is disconnected from the rotary chuck, the corresponding pin and insert can be lifted conjointly away from the chuck by pulling upwardly on the corresponding pin.

In yet another aspect, the present invention relates to an upper plate assembly for use in a rotary chuck for processing wafer-shaped articles, comprising an upper plate having formed therein a circular series of openings whose size and position is selected to allow a corresponding one of a peripheral series of pins to pass through a respective one of the openings when the upper plate is mounted on a rotary chuck. Each of the openings adjoins a corresponding recess formed in an upper surface of the upper plate. The assembly includes a set of inserts, a respective one of the inserts corresponding to each of the recesses, the inserts each having a hole through which an upper part of one of a peripheral series of pins can pass when the insert is received in its corresponding recess and when the upper plate is mounted on a rotary chuck. Each of the inserts is individually connectable to the upper plate by a respective connecting mechanism.

In preferred embodiments of the upper plate assembly according to the present invention, each the insert is secured to the upper plate by a pair of screws.

In preferred embodiments of the upper plate assembly according to the present invention, each of the pair of screws has a collar that keeps the screw attached to the insert.

In preferred embodiments of the upper plate assembly according to the present invention, each insert comprises screw threading on a lower surface thereof and is screwed into a threaded bore formed with the recess.

BRIEF DESCRIPTION OF THE DRAWINGS

Other objects, features and advantages of the invention will become more apparent after reading the following detailed description of preferred embodiments of the invention, given with reference to the accompanying drawings, in which.

DETAILED DESCRIPTION OF PREFERRED EMBODIMENTS

Figure 1:
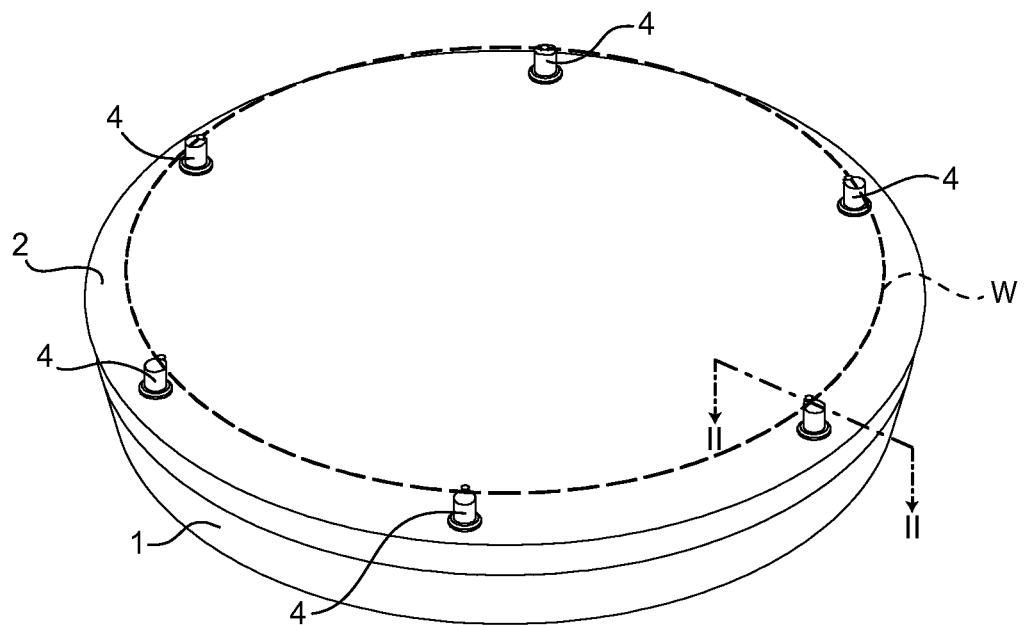
FIG. 1 is a perspective view of a conventional rotary chuck.

Referring now to the drawings, FIG. 1 depicts a conventional spin chuck that holds a wafer W thereon in a generally horizontal orientation. The spin chuck includes a rotary base body 1 to which upper plate 2 is connected. A series of pin assemblies 4 project upwardly through openings formed in the upper plate 2.

Figure 2:
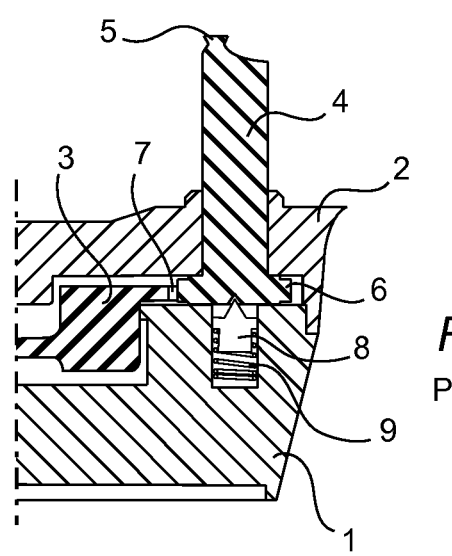
FIG. 2 is a partial sectional view taken along the line II-II of FIG. 1.

As shown in greater detail in FIG. 2, each pin assembly 4 comprises an enlarged based equipped with gear teeth 6, which mesh with the gear teeth 7 of a common ring gear 3 that drives all of the pin assemblies 4 in unison. Because the contact region 5 of each pin assembly 4 is eccentric to the rotational axis of the pin assembly, that rotation displaces the contact region 5 radially of the spin chuck, as described for example in U.S. Pat. Nos. 4,903,717 and 5,513,668. The correct positioning of the pin assemblies 4 is aided by respective needle bearings 8 and associated springs 9.

However, as discussed above, in order to remove any given pin assembly 4 for repair or maintenance or replacement, the entire chuck must be disassembled, including removing the upper plate 2 from the chuck base body 1.

Figure 3:
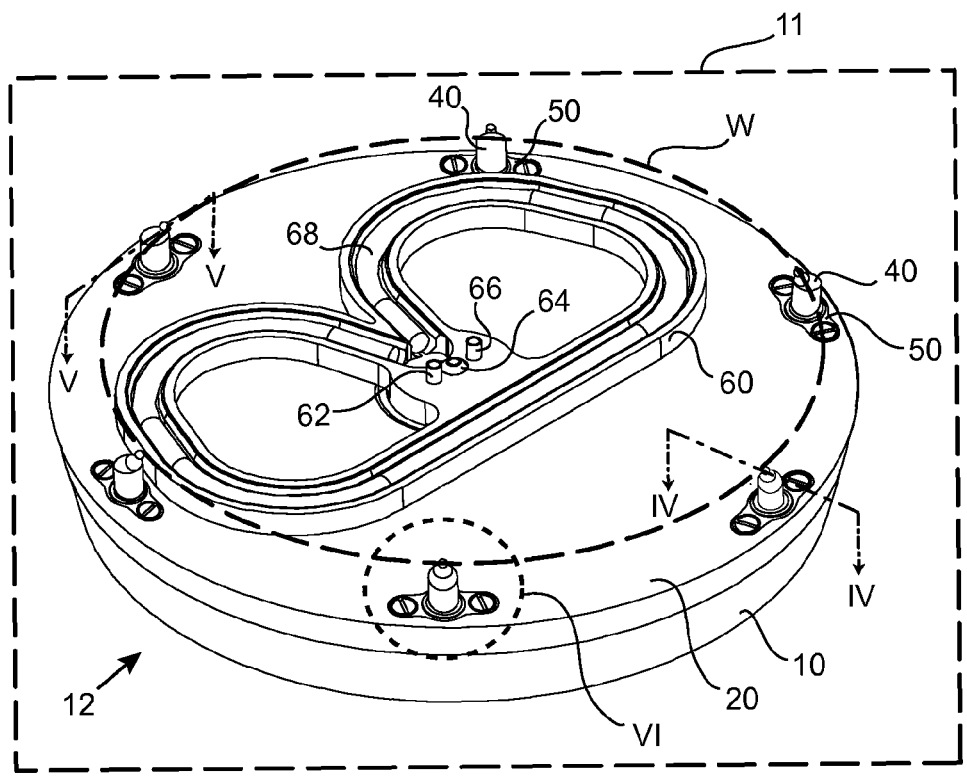
FIG. 3 is a perspective view of a rotary chuck according to an embodiment of the present invention.

Referring now to FIG. 3, in a first embodiment according to the invention, a rotary chuck 12 is mounted in a process module 11 for single wafer wet processing of semiconductor wafers. Each chuck 12 holds a single wafer, but there may be a plurality of such chuck mounted in a given process module 11, with the chucks being controlled by common control mechanisms and supplied by common wafer handling equipment. Pin assemblies 40 are positioned so as to hold a wafer W of a predetermined diameter, for example, 300 mm or 450 mm. Rotary chuck 12 comprises a chuck base body 10 and an upper plate 20 secured thereto.

An infra-red heating assembly 60 comprising one or more IR lamps 68 is positioned above the upper plate 20 of the chuck 12. As described more fully in commonly-owned copending application U.S. 2013/0061873, the heating assembly 60 is mounted on a stationary post that passes through the center of chuck 12, so that the heating assembly 60 remains stationary as the chuck 12 rotates. Furthermore, the heating assembly, although above the upper plate, is below the level at which a wafer W is held by pin assemblies 40, so that the heating assembly 60 heats a wafer W from the underside. The stationary structure also accommodates fluid supply nozzles 62, 64, 66, which supply respectively different gases and/or liquids to the underside of a wafer W.

Figure 4:
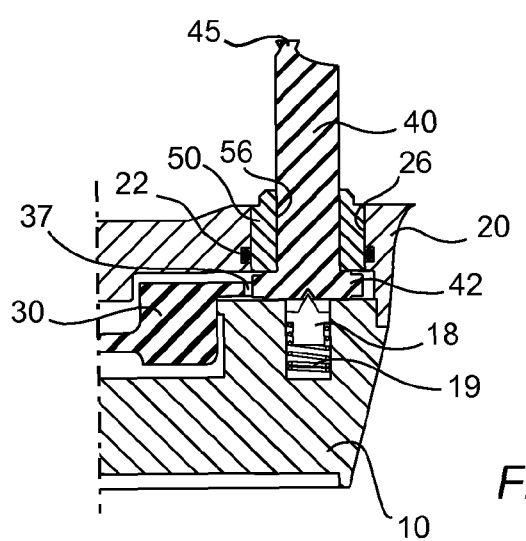
FIG. 4 is a partial sectional view taken along the line IV-IV of FIG. 3.

As shown in FIG. 4, each pin assembly 40 projects upwardly from the upper plate 20, passing through a respective opening 26 that traverses the upper plate 20. Unlike in the spin chuck of FIGS. 1 and 2, in the present embodiment the opening 26 is sufficiently wide to permit the entire pin assembly, including the enlarged base 42 thereof, to be removed through the opening 26.

Also positioned within the opening 26 of upper plate 20, and surround the main shaft of pin assembly 40, is an insert 50. An O-ring 22 is seated in a groove formed in opening 26, to prevent liquid from entering the chuck 12 between the insert 50 and the upper plate 20. Insert 50 includes an opening 56 which, like opening 26, is preferably cylindrical. The width (or diameter) of opening 56 is however less than that of opening 26, so that the main shaft of the pin assembly 40 can pass through the opening 56, but the enlarged base portion 42 cannot pass through opening 56.

Also visible in FIG. 4 are a ring gear 30 that meshes via teeth 37 with corresponding teeth formed on the enlarged base portion 42 of each pin assembly 40, and a needle bearing 18 and associated spring 19, for positioning the respective pin assembly 40.

Figure 5:
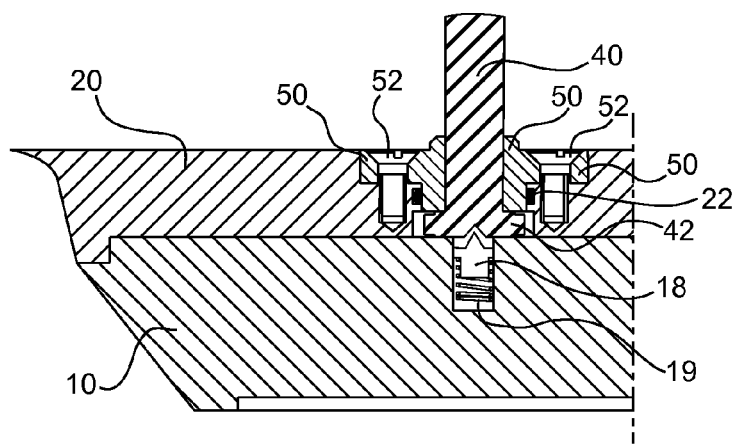
FIG. 5 is a partial sectional view taken along the line V-V of FIG. 3.
Figure 6:
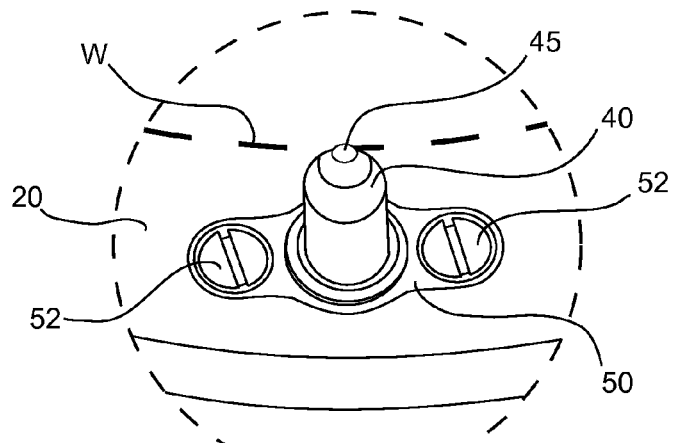
FIG. 6 is an enlarged view of the detail VI in FIG. 3.
Figure 7:
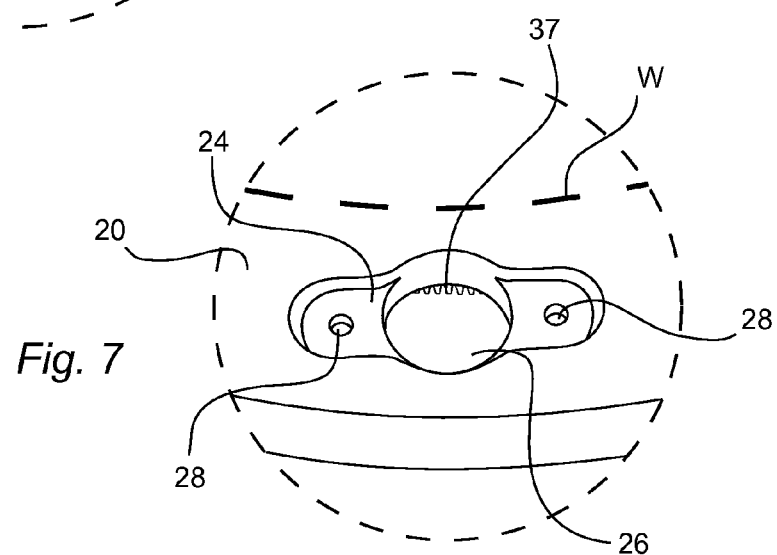
FIG. 7 is a view corresponding to FIG. 6, in which the pin assembly and insert have been removed.

Turning now to FIGS. 5-7, it can be seen that each insert 50 is secured to the upper plate 20 by a pair of screws 52. In particular, each insert 50 is received in a corresponding recess 24 formed in the upper plate 20. Recess 24 includes the opening 26 that traverses the upper plate 20, and a pair of recessed, non-traversing regions in which bores 28 are formed for receiving the screws 52.

Thus, to remove a pin assembly 40 from the chuck 12 of FIGS. 3-7, it is necessary only to unscrew the screws 52, whereafter the pin assembly can be grasped, for example at the contact region 45 thereof, and lifted out of engagement with teeth 37 of ring gear 30, up and out of the chuck through opening 26 in the upper plate 20, along with the insert 50 that will remain captive on the pin assembly 40.

It will be appreciated that the above operation is much quicker and simpler than in the prior art, as the chuck 12 need not be disassembled or removed from its drive and elevating unit, or, indeed, even removed from its surrounding process module 11.

Figure 8:
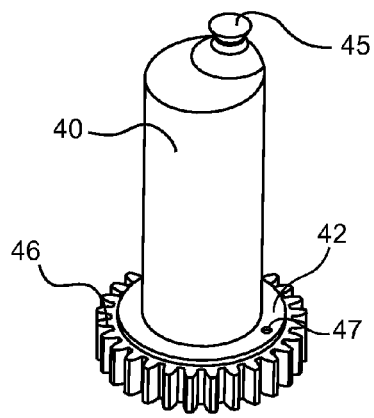
FIG. 8 is a perspective view of a pin assembly suitable for use in preferred embodiments of the present invention.

FIG. 8 shows a pin assembly 40 more clearly, including the eccentric contact region 45 that bears against a wafer edge in use, and also provides subjacent support to the wafer so that it is maintained at a predetermined distance above the upper plate 20. Also shown is the enlarged base portion 42, which includes gear teeth 46 formed integrally therewith, the gear teeth 42 of each pin assembly in use being in simultaneous meshing engagement with the gear teeth 37 of common ring gear 30.

Pin assembly 40 also preferably includes a registration or "timing" mark, such as the hole 47 formed in the enlarged base portion 42, which is formed at the same angular position on each of the pin assemblies 40, so that each pin assembly 40 can be more readily inserted into the chuck through opening 26 and into meshing engagement with the gear teeth 37 of gear ring 30 in its correct angular orientation relative to the other pin assemblies 40.

Figure 9:
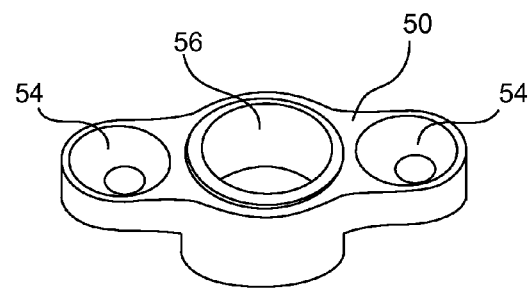
FIG. 9 is a perspective view of an insert suitable for use in preferred embodiments of the present invention.

FIG. 9 shows an insert 50 more clearly, including the central opening 56 through which the main shaft of pin assembly 40 may pass, but which does not permit passage of the enlarged base portion 42, and a pair of openings 54 that receive the screws 52 in this embodiment so that the flat heads of the screws are flush mounted with the upper surface of the insert 50.

Figure 10:
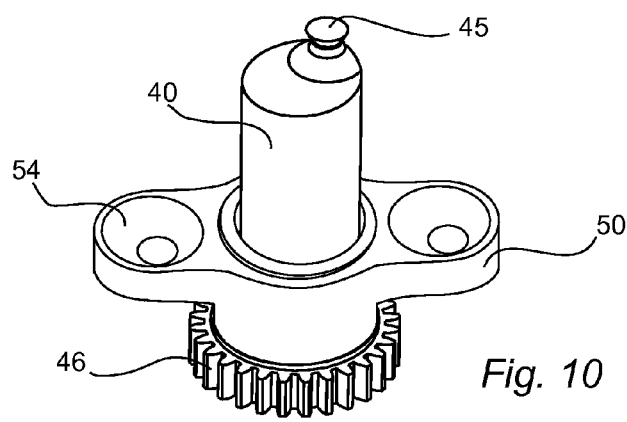
FIG. 10 is a perspective view of a pin assembly as in FIG. 8 combined with an insert as in FIG. 9.

In FIG. 10, the insert 50 is shown captive on the pin assembly 40, as it would be in use and also when the screws 52 are removed and the pin assembly 40 is extracted from the chuck 12 by lifting the pin assembly 40 and insert 50 out of the upper plate 20 of the chuck 12.

Figure 11:
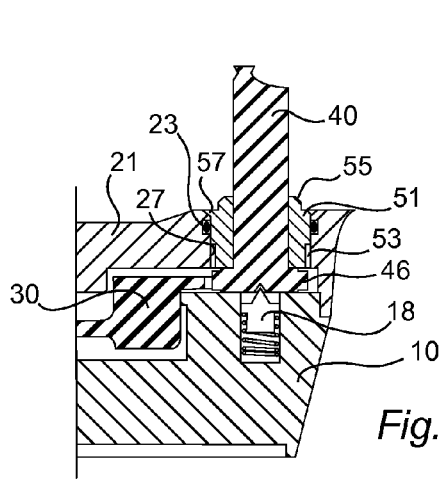
FIG. 11 is a view similar to FIG. 4, of another embodiment of an insert suitable for use in preferred embodiments of the present invention.

FIG. 11 shows another embodiment of an insert 51 suitable for use in preferred embodiments according to the present invention. The insert 51 of FIG. 11 is in general symmetrical about the rotational axis of pin assembly 40, and is secured to the upper plate 21 not by separate screws 52 but instead by its own screw threading 53 that mates with corresponding threading formed in the threaded bore 27 of plate 21.

The part 55 of insert 51 that projects above the surface of upper plate 21 is preferably nut-shaped, so as to be able to receive a deep socket that has clearance for the pin assembly 40 and allows the insert 51 to be screwed into the threaded bore 27 of upper plate 21.

An O-ring 23 is seated in a groove of the bore 27 above the threaded part thereof, to prevent liquid from seeping between the insert 51 and the upper plate 21. Alternatively or in addition, the insert 21 may be formed with a lip seal 57 that creates a friction fit between the insert 51 and the upper plate 21.

Figure 12:
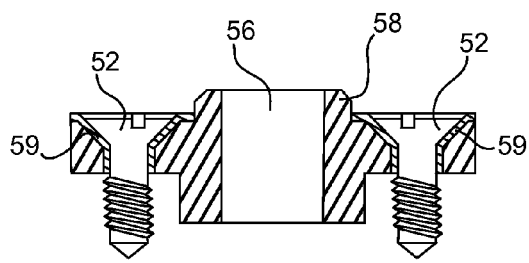
FIG. 12 is a cross-section through yet another embodiment of an insert suitable for use in preferred embodiments of the present invention.

Lastly, in FIG. 12, yet another embodiment of an insert 58 is illustrated, which is like the insert 50 described in connection with FIGS. 5-7, but in which the screws 52 are captive within the insert 58, by virtue of collars 59, which permit the screws 52 to be screwed and unscrewed from the bores 28 in recess 24, but which prevent the screws 52 from being removed from the insert 58. This embodiment therefore further simplifies the assembly and disassembly of pin assemblies from the upper plate, as it eliminates any risk of the screws 52 falling into the chuck 12 or elsewhere in the process module 11.

While the present invention has been described in connection with various preferred embodiments thereof, it is to be understood that those embodiments are provided merely to illustrate the invention, and should not be used as a pretext to limit the scope of protection conferred by the true scope and spirit of the appended claims.

What is claimed is:

1. Apparatus for processing wafer-shaped articles, comprising a rotary chuck adapted to hold a wafer shaped article thereon, the rotary chuck comprising a peripheral series of pins configured to contact an edge region of a wafer-shaped article, each of said pins projecting upwardly from the rotary chuck, and each of said pins being individually secured to said rotary chuck by a respective connecting mechanism, wherein any selected one of said pins is adapted to be removed from the rotary chuck by disconnecting its corresponding connecting mechanism without removing any structure of the rotary chuck that surrounds any others of said pins;

wherein each said connecting mechanism comprises an insert having an opening through which an upper part of a corresponding pin is adapted to pass, each said pin comprising a base portion that is wider than the opening in its corresponding insert, each said insert being received in a corresponding recess formed in an upper surface of said rotary chuck and being fastened to said rotary chuck with the base portion of a corresponding pin captive within said rotary chuck beneath said insert.

2. The apparatus according to claim 1, wherein said rotary chuck comprises a chuck base body and a cover, and wherein each of said pins projects upwardly from said cover.

3. The apparatus according to claim 1, wherein said rotary chuck is mounted for rotation about a central spindle, and wherein a heating assembly is stationarily mounted above an upper surface of rotary chuck and below a level at which said pins contact an edge of a wafer-shaped article.

4. The apparatus according to claim 1, wherein when said connecting mechanism is disconnected from said rotary chuck, the corresponding pin and insert are adapted to be lifted conjointly away from the chuck by pulling upwardly on the corresponding pin.

5. The apparatus according to claim 1, further comprising a ring gear mounted interiorly of said chuck, said ring gear being in simultaneous meshing engagement with each of said peripheral series of pins.

6. The apparatus according to claim 5, wherein each of said circular series of pins has an enlarged base confined within said rotary chuck and comprising gear teeth meshing with said ring gear.

7. The apparatus according to claim 1, wherein said insert is secured to said rotary chuck by a pair of screws.

8. The apparatus according to claim 7, wherein each of said pair of screws has a collar that keeps the screw attached to the insert.

9. The apparatus according to claim 1, wherein said insert comprises screw threading on a lower surface thereof and is screwed into a threaded bore formed with said recess.

10. The apparatus according to claim 1, further comprising an O-ring mounted in a groove surrounding said recess, to prevent ingress of liquid into said rotary chuck between said insert and said recess.

11. The apparatus according to claim 1, further comprising a lip seal mounted between said insert and a shoulder of said recess, to prevent ingress of liquid into said rotary chuck between said insert and said recess.

12. The apparatus according to claim 1, wherein each of said series of pins and its associated connecting mechanism is made from one or more chemically-resistant plastics selected from the group consisting of polytetrafluoroethylene (PTFE), perfluoroalkoxy (PFA), polyphenylenesulfide (PPS), polyetheretherketone (PEEK), polystyrene/polyethylstyrene (PS/PES), ethylene tetrafluoroethylene (ETFE), polyvinylidene fluoride (PVDF), homopolymer of chlorotrifluoroethylene (PCTFE), fluorinated ethylene propylene (FEP), and ethylene chlorotrifluoroethylene (ECTFE).

13. A rotary chuck for processing wafer-shaped articles, said rotary chuck being adapted to hold a wafer shaped article thereon, said rotary chuck comprising a peripheral series of pins configured to contact an edge region of a wafer-shaped article, each of said pins projecting upwardly from an upper plate of said rotary chuck, and each of said pins being individually secured to said upper plate by a respective connecting mechanism, wherein any selected one of said pins is adapted to be removed from the rotary chuck by disconnecting its corresponding connecting mechanism without removing said upper plate;

wherein each said connecting mechanism comprises an insert having an opening through which an upper part of a corresponding pin is adapted to pass, each said pin comprising a base portion that is wider than the opening in its corresponding insert, each said insert being received in a corresponding recess formed in said upper plate and being fastened to said rotary chuck with the base portion of a corresponding pin captive within said rotary chuck beneath said insert.

14. The rotary chuck according to claim 13, wherein when said connecting mechanism is disconnected from said rotary chuck, the corresponding pin and insert are adapted to be lifted conjointly away from the chuck by pulling upwardly on the corresponding pin.

15. An upper plate assembly for use in a rotary chuck for processing wafer-shaped articles, comprising an upper plate having formed therein a circular series of openings whose size and position is selected to allow a corresponding one of a peripheral series of pins to pass through a respective one of the openings when the upper plate is mounted on a rotary chuck, each of the openings adjoining a corresponding recess formed in an upper surface of the upper plate; and a set of inserts, a respective one of said inserts corresponding to each of said recesses, said inserts each having a hole through which an upper part of one of a peripheral series of pins is adapted to pass when the insert is received in its corresponding recess and when said upper plate is mounted on a rotary chuck, each of said inserts being individually connectable to said upper plate by a respective connecting mechanism.

16. The upper plate assembly according to claim 15, wherein each said insert is secured to said upper plate by a pair of screws.

17. The upper plate assembly according to claim 16, wherein each of said pair of screws has a collar that keeps the screw attached to the insert.

18. The upper plate assembly according to claim 16, wherein each said insert comprises screw threading on a lower surface thereof and is screwed into a threaded bore formed with said recess.

* * * * *